US010158375B1

(12) United States Patent
Carbajal Ipenza

(10) Patent No.: US 10,158,375 B1
(45) Date of Patent: Dec. 18, 2018

(54) PDM BITSTREAM TO PCM DATA CONVERTER USING WALSH-HADAMARD TRANSFORM

(71) Applicant: NXP USA, INC., Austin, TX (US)

(72) Inventor: Sammy Johnatan Carbajal Ipenza, Sao Paulo (BR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/927,602

(22) Filed: Mar. 21, 2018

(51) Int. Cl.
| H03M 3/00 | (2006.01) |
| H03M 7/30 | (2006.01) |
| G06F 3/16 | (2006.01) |
| H03H 17/04 | (2006.01) |

(52) U.S. Cl.
CPC .......... *H03M 7/3004* (2013.01); *G06F 3/165* (2013.01); *H03H 17/04* (2013.01); *H03M 3/30* (2013.01)

(58) Field of Classification Search
CPC ...... H03M 7/3004; H03M 3/30; H03H 17/04; G06F 3/165
USPC ......................................................... 341/143
See application file for complete search history.

(56) References Cited

U.S. PATENT DOCUMENTS

| 4,038,539 | A * | 7/1977 | Van Cleave | ....... | H03H 21/0012 |
| | | | | | 327/553 |
| 8,990,142 | B2 * | 3/2015 | Lynch | ................ | G06Q 30/0204 |
| | | | | | 455/2.01 |
| 2004/0254797 | A1 | 12/2004 | Niamut et al. | | |

OTHER PUBLICATIONS

Deng, G. et al. "A Running Walsh-Hadamard Transform Algorithm and its Application to Isotropic Quadratic Filter Implementation." 1996 $8^{th}$ European Signal Processing Conference (EUSIPCO 1996), Trieste, Italy, 1996 pp. 1-4.
Peceli, G. et al. "Digital Filters Based on Recursive Walsh-Hadamard Transformation." In *IEEE Transactions on Circuits and Systems*. vol. 37, No. 1, pp. 150-152. Jan. 1990.
Boules, R.N. "Adaptive Filtering Using the Fast Walsh-Hadamard Transformation." In *IEEE Transactions in Electromagnetic Compatibility*. vol. 31, No. 2, pp. 125-128. May 1989.
Pratt, W.K. et al. "Hadamard Transform Image Coding." In *Proceedings of the IEEE*, vol. 57, No. 1. pp. 58-68. Jan. 1969.

\* cited by examiner

*Primary Examiner* — Khai M Nguyen

(57) ABSTRACT

A decimation filter including a Hadamard-Walsh transform circuit, a comparator, and an inverse Hadamard-Walsh transform circuit. The Hadamard-Walsh transform circuit includes an input receiving a pulse density modulation bitstream and an output providing a stream of digital samples. The comparator replaces each digital sample that has a magnitude below a predetermined threshold value with a zero value and provides adjusted digital samples. The inverse Hadamard-Walsh transform circuit has an input receiving the adjusted digital samples and has an output providing pulse code modulation data values. The decimation filter may further include a down-sampler that down samples the adjusted digital samples by before being provided to the inverse Hadamard-Walsh transform circuit. The decimation filter may include a low pass filter and another down-sampler at the output. The Hadamard-Walsh transform circuits may be implemented according to the fast Hadamard-Walsh transform so that only digital additions and subtractions are performed.

20 Claims, 6 Drawing Sheets

PDM BITSTREAM TO PCM DATA CONVERTER USING WALSH-HADAMARD TRANSFORM

BACKGROUND OF THE INVENTION

Field of the Invention

The present invention relates in general to signal processing, and more specifically to demodulating a Pulse Density Modulation (PDM) bitstream and converting the PDM bitstream into a Pulse Code Modulation (PCM) signal using the Walsh-Hadamard transform.

Description of the Related Art

Pulse Density Modulation (PDM) is a conventional way to deliver audio from a microphone to a processor in several applications, such as mobile telephones and the like. PDM is a form of modulation in which an analog signal is represented as a binary signal, otherwise referred to as a bitstream. Current digital audio systems, however, use a multibit format to represent the audio signal, such as based on Pulse Code Modulation (PCM). PCM is a method used to digitally represent sampled analog signals, including audio signals, and is a standard form of digital audio used in computers, compact discs, digital telephony, and other types of digital audio applications. In a PCM stream, the amplitude of the analog signal is sampled regularly at uniform intervals, and each sample is quantized to the nearest digital value within a range of digital value steps. In this manner, each PCM sample is a multibit value.

A digital signal processor (DSP) or the like typically includes a PDM to PCM converter that transforms PDM to PCM for use by the processor. The conventional PDM converter was relatively complex and expensive from a circuit standpoint. The conventional converter may be configured as a decimator or decimation filter, which was conventionally implemented with a set of filters including a cascaded integrated comb (CIC) filter, a half-band filter, a finite impulse response (FIR) filter, etc. The filter set in the conventional configurations had to be separately designed and tuned for each application, and digital filter implementations often included computationally complex components, such as digital multipliers and the like.

BRIEF DESCRIPTION OF THE DRAWINGS

Embodiments of the present invention are illustrated by way of example and are not limited by the accompanying figures, in which like references indicate similar elements. Elements in the figures are illustrated for simplicity and clarity and have not necessarily been drawn to scale.

DETAILED DESCRIPTION

The inventor has recognized that conversion from PDM to PCM is useful in many digital signal processing configurations. The conventional PDM to PCM conversion process requires, however, rather complex filters or complex digital processing, such as digital multiplication and the like. He has therefore developed a system and method of converting PDM to PCM using the Walsh-Hadamard (WH) transform. In one embodiment, the conversion process is performed using the Fast Walsh-Hadamard (FWH) transform, which uses simpler digital processing circuitry such as digital adders and the like.

Figure 1:
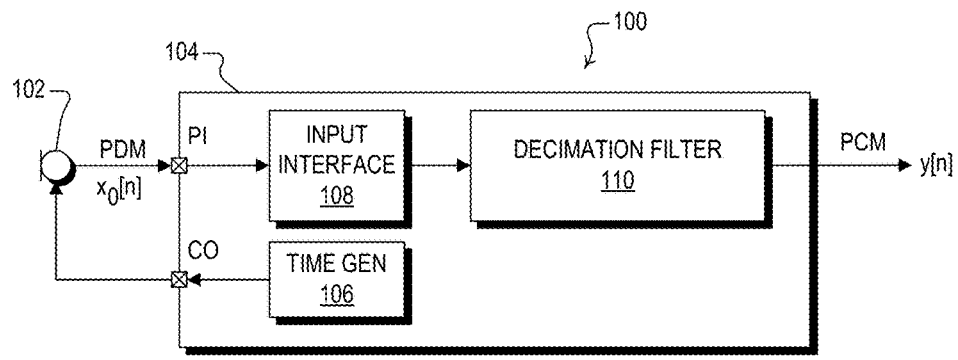
FIG. 1 is a simplified block diagram of an audio system including a decimation filter implemented according to one embodiment.

FIG. 1 is a simplified block diagram of an audio system 100 including a decimation filter implemented according to one embodiment. The audio system 100 includes a PDM microphone 102 coupled to a processing device 104, which may be configured on an integrated circuit (IC) or semiconductor device or the like. The processing device 104 may incorporate a clock generator 106, which outputs a clock signal via a pin CO to a clock input of the PDM microphone 102 to establish a common time reference. The PDM microphone 102 generates a PDM output signal in the form of a PDM bitstream $x_0[n]$ provided to an input pin PI of the processing device 104. The PDM bitstream is processed through an input interface 108 and provided to an input of the decimation filter 110. The decimation filter 110 converts the PDM bitstream to a PCM signal $y[n]$ at its output, in which the PCM signal incorporated PCM data.

The PDM bitstream $x_0[n]$ is a binary signal in the form of a stream of binary 1's and 0's. The PCM signal $y[n]$ is a digital signal in the form of a stream of digital multibit codes or values. Although not explicitly shown, the PCM signal is provided to a processor or the like of the processing device 104 for additional processing.

Figure 2:
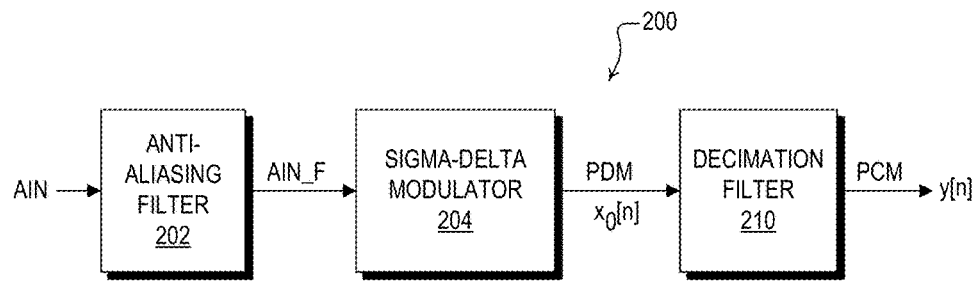
FIG. 2 is a simplified block diagram of an analog conversion system including a decimation filter implemented according to one embodiment.

FIG. 2 is a simplified block diagram of an analog conversion system including a decimation filter 200 implemented according to one embodiment. An analog input signal AIN is provided to the input of an analog filter 202, such as an anti-aliasing filter or the like, which provides a filtered analog signal AIN_F to an input of a sigma-delta modulator 204. An anti-aliasing filter attenuates higher frequencies and prevents aliasing components from being sampled. The sigma-delta modulator 204 samples the filtered analog signal AIN_F and outputs a PDM bitstream $x_0[n]$ to the decimation filter 210, which converts the PDM bitstream to a PCM signal $y[n]$. The decimation filters 110 and 210 may be implemented in a similar manner.

In conventional configurations, a decimation filter used for converting PDM to PCM was implemented with a set of filters including a cascaded integrated comb (CIC) filter, a half-band filter, a finite impulse response (FIR) filter, etc. One or more of the filters in the filter set of the conventional configuration had to be separately designed and tuned for each application, and digital filter implementations often included computationally complex components, such as digital multipliers and the like. The decimation filters 110 and 210, however, are instead based on the Hadamard-Walsh (HW) transform. The HW transform is used in data encryption as well as many signal processing and data compression algorithms, such as JPEG XR (Joint Photographic Experts Group extended range) and MPEG-4 AVC (Moving Picture Experts Group, Advanced Video Coding). In video compression applications, it is usually used in the form of the sum of absolute transformed differences. The HW transform, however, has not been known to be used for decimation filters.

The basis matrix of the HW transform, which is known as a Hadamard matrix, carries elements +1 or −1 only and is given by the following equation (1):

$$H_2 = \begin{bmatrix} 1 & 1 \\ 1 & -1 \end{bmatrix} \quad (1)$$

which is a Hadamard matrix for N=2. Hadamard matrices of higher order can be generated by using the recursive property of Hadamard matrix as shown in the following equation (2):

$$H_{2N} = \begin{bmatrix} H_N & H_N \\ H_N & -H_N \end{bmatrix} \quad (2)$$

where $H_N$ is an N×N Hadamard matrix. The HW transform is an orthogonal, symmetric and linear transform.

If an array f(x) represents the intensity samples of a one-dimensional signal over an array of N points, then the one-dimensional HW transform, F(u), of f(x) is given by the matrix product according to the following equation (3):

$$[F(u)] = H_N[f(x)] \quad (3)$$

Due to the symmetric Hadamard matrix property, HH=NI, the Inverse HW transform is defined by the following equation (4):

$$[f(x)] = \frac{1}{N} H_N[F(u)] \quad (4)$$

The Fast Walsh-Hadamard (FWH) transform is an efficient algorithm to compute the HW transform. The FWH requires only $N \cdot \log_2(N)$ additions or subtractions as further described herein.

Figure 3:
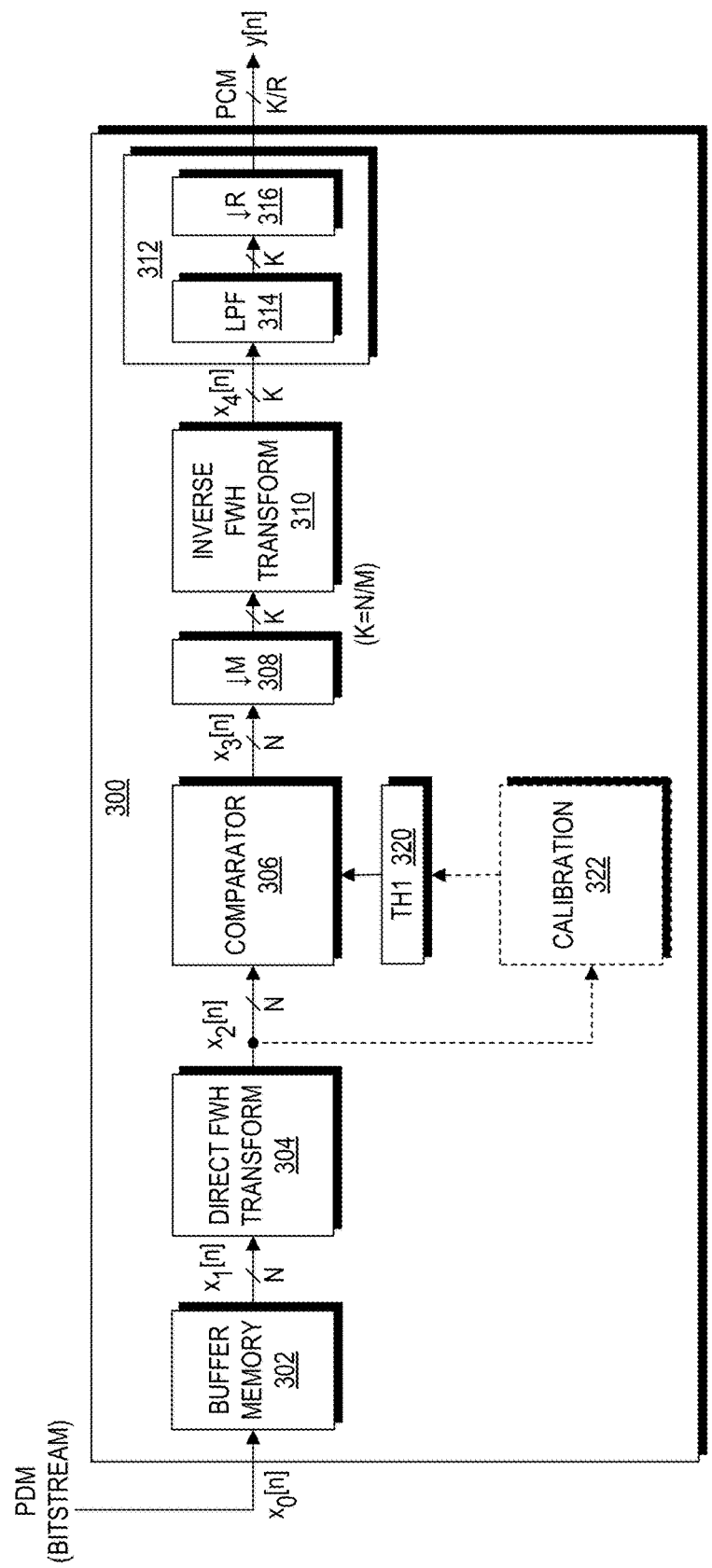
FIG. 3 is a simplified block diagram of a decimation filter implemented according to one embodiment which may be used as either one or both of the decimation filters of FIGS. 1 and 2.

FIG. 3 is a simplified block diagram of a decimation filter 300 implemented according to one embodiment which may be used as either one or both of the decimation filters 110 and 210. The PDM bitstream $x_0[n]$ is provided to an input of a buffer memory 302, which stores and outputs "N" bit samples of the input PDM stream at a time. The notation "[n]" simply refers to individual bits or samples in the stream of bits or values, and it not to be confused with the integer value "N". N is a positive integer that is power of 2 (e.g., 2, 4, 8, 16, etc.). The output of the buffer memory 302 provides N bit samples at a time, shown as $x_1[n]$, to an input of a direct FWH transform circuit 304. The buffer memory 302 may store multiple groups of N bit samples at a time, in which it accumulates and then outputs a first group of N samples while it is accumulating the next group of N samples, and so on. As described further herein, the direct FWH transform circuit 304 performs $N \cdot \log_2(N)$ additions and subtractions without performing any multiplication or any other complex digital operations. The direct FWH transform circuit 304 outputs FWH samples, shown as $x_2[n]$, to an input of a comparator 306. The comparator 306 compares the absolute value (or magnitude) of each FWH sample with a threshold value TH1, in which those samples having a magnitude less then TH1 are replaced by a zero (0) value.

The comparator 306 outputs threshold adjusted FWH samples, shown as $x_3[n]$, to an input of a down-sampler 308. The down-sampler 308 down samples the FWH samples by another integer value M, in which K resulting FWH samples are provided to an input of an inverse FWH transform circuit 310, where K=M/N. Based on the symmetry of the Hadamard matrix, as further described herein, the inverse FWH transform circuit 310 may be configured in substantially the manner as the direct FWH transform circuit 304. In fact, the circuitry of the FWH transform circuit 304 may be used in whole (when K=N) or in part (when K<N) rather than providing separate circuitry for the inverse FWH transform circuit 310. Also, after down-sampling, the inverse FWH transform circuit 310 performs only $K \cdot \log_2(K)$ addition or subtraction operations (in which K N). The inverse FWH transform circuit 310 outputs converted PCM data samples, shown as $x_4[n]$, to an input of an additional output filter circuit 312, which outputs the PCM data. The output of the inverse FWH transform circuit 310 is in the form of PCM data so that the additional filter circuit 312 may be omitted.

In one embodiment, the additional filter circuit 312 includes a low-pass filter (LPF) 314 followed by a down-sampler 316, which down samples the PCM data stream by another integer value R. In one embodiment, the LPF 314 has a center frequency (fc) that is less than or equal to one-half the output frequency (fo) of the PCM data, or fc≤fo/2. The additional filter circuit 312 may be provided to ensure that high frequency information is reduced or otherwise eliminated.

TH1 may be a fixed value which may depend on the modulator architecture along with the noise shaping and the modulator implementation. A memory 320, such as an internal register or memory location or the like, stores TH1 for access by the comparator 306. A calibration block 322 receives N of the $x_2[n]$ samples and determines and stores TH1 into the memory 320. The calibration block 322 may perform the calibration process once, such as upon an initial N samples, and the resulting threshold value TH1 stored in the memory 320 for use by the comparator 306. Alternatively, the calibration block 322 may perform calibration on a regular basis, such as being executed for each N of the $x_2[n]$ samples during run-time operation, in which it periodically updates TH1. The calibration block 322 is shown using dashed/dotted lines since in one embodiment, the calibration block 322 may be omitted in which the calibration process may be performed separately by the processor or the like, such as implemented in software or as an initialization routine. Although a run-time configuration may provide more accurate results, TH1 may simply be determined and stored once for a given configuration.

The calibration process is as follows. The direct FWH transform circuit 304 transforms N of the $x_2[n]$ samples. A sigma value a is determined using the output of the direct FWH transform circuit 304 according to the following equation (1):

$$\sigma^2 = \frac{\sum_{i=0}^{N-1}(x_2[i])^2}{N} \quad (1)$$

in which "n" is replaced by an index value "i" that is incremented from 0 to N−1. Then, the threshold value TH1 is calculated as TH1=4σ. Once calculated, TH1 is stored into the memory 320 (or used to update the TH1 stored in the memory 320).

The M and R decimation values are used to convert the relative data rates between the input bitstream rate (input frequency fi) of $x_0[n]$ and the output data rate (output frequency fo) of the PCM data values y[n], in which fo=fi/(M·R). An audio application, for example, may have a PCM data rate of fo=48 kilohertz (KHz), whereas the input bitstream is provided at fi=3.072 megahertz (MHz). In this example, M·R is 64. If the additional output filter circuit 312 is not provided, then M=64. In another embodiment, or M=64 and R=1; in many applications, it may be advantageous to set R to 1 and adjust M accordingly. In general, the M and R values are set to adjust the difference between the input and output frequency or data rate.

Figure 4:
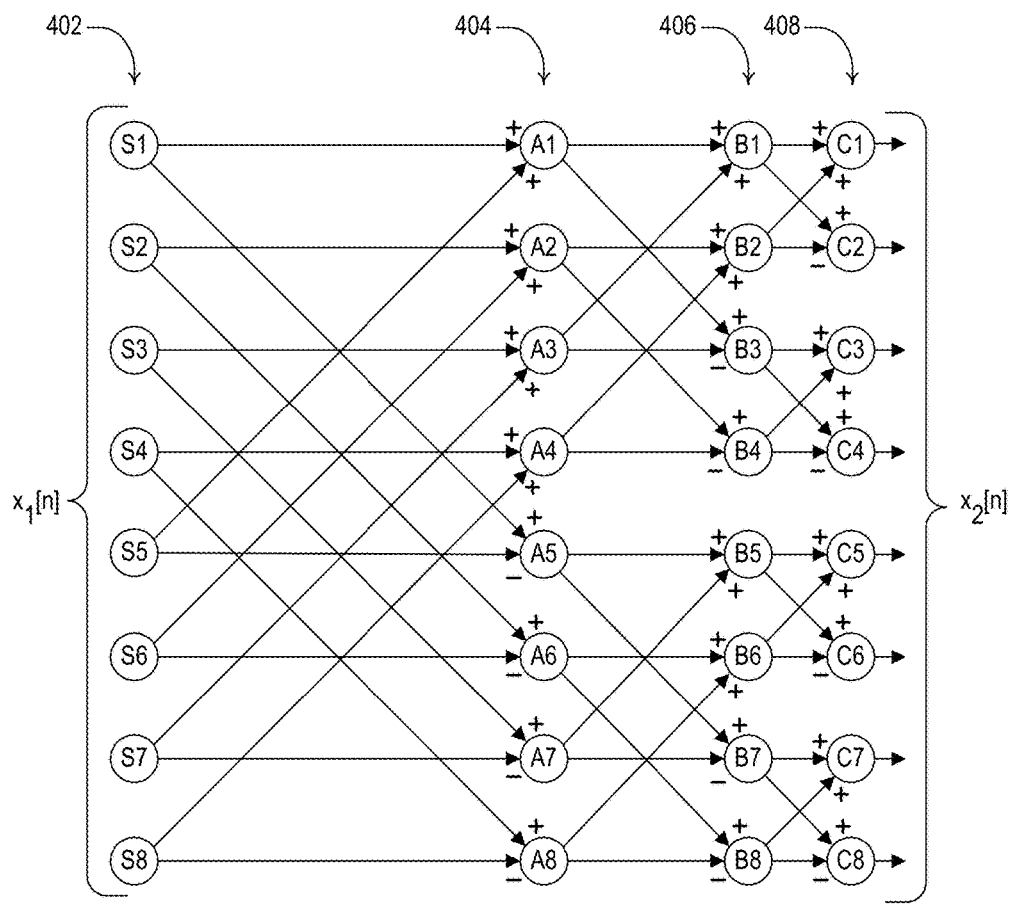
FIG. 4 is a simplified depiction of an 8×FWH transform according to one embodiment applied to a one-dimensional vector of 8 input samples for N=8.

FIG. 4 is a simplified depiction of an 8×FWH transform 400 according to one embodiment applied to a one-dimensional vector of 8 input samples for N=8. A set of nodes 402, individually shown as S1, S2, . . . , S8 (S1-S8), receive the input bits of $x_1[n]$, or $x_1[0]$-$x_1[7]$, respectively.

Each of the nodes 402 provides its stored sample via one or more output paths. A set of adders 404 each add or subtract two selected samples as indicated by arrows from the input nodes S1-S8 and output the result. As used herein, the term "adder" is intended to be used generically to apply either to addition or subtraction. For example, each adder 404 may provide a sum or a difference result. In one embodiment, the samples may include a sign bit so that subtraction may be implemented by adding a positive value to a negative value. The adders 404 are individually shown as A1, A2, . . . , A8 (A1-A8), in which A1=S1+S5, A2=S2+S6, A3=S3+S7, A4=S4+S8, A5=S1−S5, A6=S2−S6, A7=S3−S7, and A8=S4−S8. Another set of adders 406 each add or subtract two selected outputs of the adders A1-A8 as indicated by corresponding arrows. The adders 406 are individually shown as B1, B2, . . . , B8 (B1-B8), in which B1=A1+A3, B2=A2+A4, B3=A1−A3, B4=A2−A4, B5=A5+A7, B6=A6+A8, B7=A5−A7, and B8=A6−A8. Yet another set of adders 408 each add or subtract two selected outputs of the adders B1-B8 as indicated by corresponding arrows. The adders 408 are individually shown as C1, C2, . . . , C8 (C1-C8), in which C1=B1+B2, C2=B1−B2, C3=B3+B4, C4=B3−B4, C5=B5+B6, C6=B5−B6, C7=B7+B8, and C8=B7−B8. The adders 408 output the FWH samples $x_2[n]$.

The adders 404 may be considered as 2 groups of 4 adders each (four adders A1-A4 and four subtractors A5-A8), the adders 406 may be considered as groups of 4 groups of 2 adders each (two adders B1-B2, two subtractors B3-B4, two adders B5-B6, and two subtractors B7-B8), and the adders C1-C8 may be considered as 4 groups of add/subtract pairs in which the first adds and the second subtracts the outputs of a corresponding pair of the adders B1-B8. This pattern continues for larger values of N assuming N is a power of 2. The grouping pattern of a 16×FWH transform (N=16, not shown), for example, follows the same pattern as the 8×FWH transform 400, except that each column of adders is doubled (e.g., 16 adders in each column) and another column of adders is added at the output. The first column of adders is grouped into 2 groups of 8, the second column of adders is grouped into 4 groups of 4, the third column of adders is grouped into 8 groups of 2, and the final column is grouped into add/subtract pairs following the same pattern. The number of bits of $x_2[n]$ at the output is $2+\log_2 N$ including one sign bit. For N=8, for example, the output includes 5 bits. In one embodiment, $N=2^{14}$ and the number of output bits is 16.

In one embodiment, the inverse FWH transform circuit 310 is configured in substantially the same manner as the FWH transform circuit 304. As previously noted, given the symmetry of the Hadamard matrix (applicable to the FWH transform), the same circuitry may be reused for both.

Figure 5:
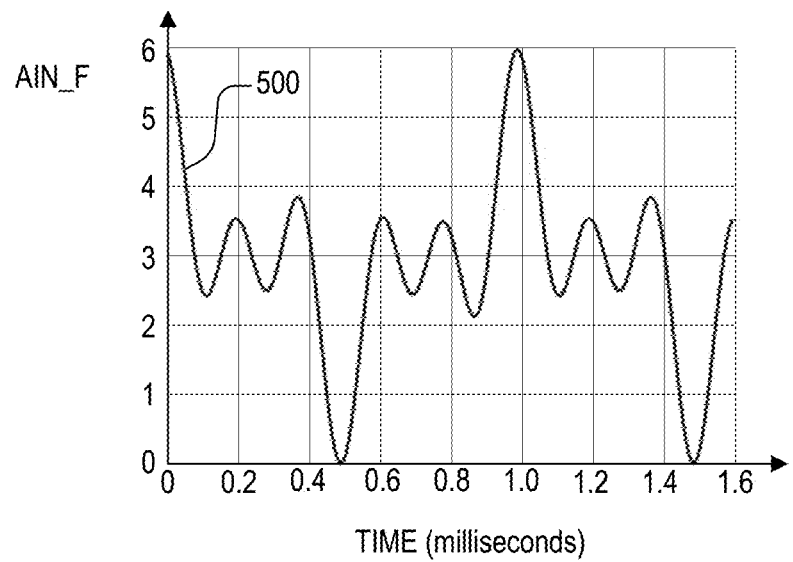
FIG. 5 is a graphic diagram of an analog signal plotted versus time that may represent an audio signal provided to the microphone of FIG. 1 or the filtered analog input signal of FIG. 2.

FIG. 5 is a graphic diagram of an analog signal 500 plotted versus time that may represent an audio signal provided to the microphone 102 in FIG. 1 or the filtered analog input signal AIN_F in FIG. 2. The analog signal 500 is a composite signal of 1 KHz, 3 KHz, and 5 KHz sine waves used for purposes of illustration.

Figure 6:
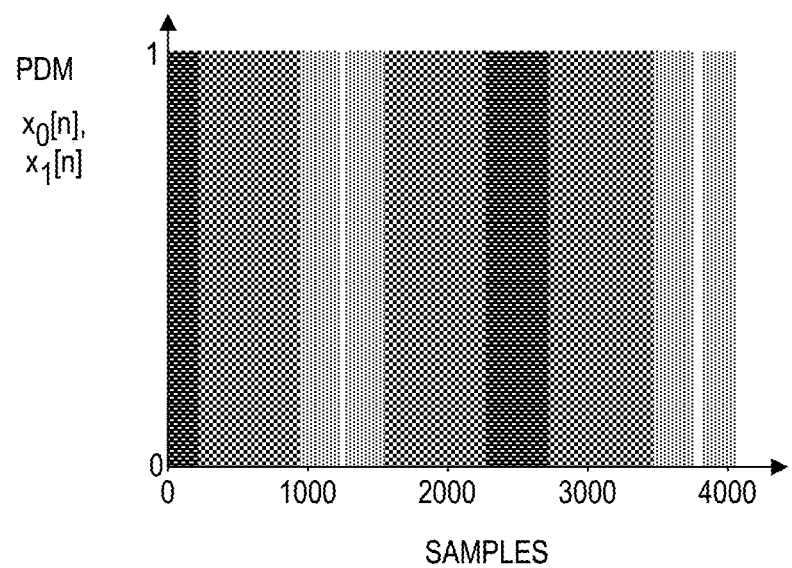
FIG. 6 is a simplified graphic diagram of a PDM bitstream versus time based on conversion of the analog signal of FIG. 5.

FIG. 6 is a simplified graphic diagram of a PDM bitstream $x_0[n]$ (and $x_1[n]$) versus time at a frequency of 2.56 MHz based on conversion of the analog signal 500 of FIG. 5. The PDM bitstream $x_0[n]$ is a stream of only 1's and 0's in which the individual bits are not easily perceived in a graphic diagram. Instead, simplified shaded regions are used to represent the relative density of 1's versus 0's, in which darker shading indicates a greater density of 1's while a lighter shading indicates a greater density of 0's. The PDM bitstream $x_0[n]$ may be generated by the microphone 102 or output from the sigma-delta modulator 204 in response to the analog signal 500. The PDM bitstream $x_0[n]$ may then be provided to the decimation filter 300 or output from the buffer memory 302 of FIG. 3. In one embodiment, the decimation filter 300 is configured to provide the PCM data at an output frequency fo of 40 MHz, in which $N=2^{14}$, M=64, R=1, and the center frequency (fc) of the LPF 314 is 6 KHz.

FIGS. 7-10 are graphic diagrams illustrating operation of the decimation filter 300 of FIG. 3 configured according to that described for FIG. 6 receiving as input the PDM bitstream $x_0[n]$ shown in FIG. 6 (based on the AIN_F signal shown in FIG. 5) according to one embodiment.

Figure 7:
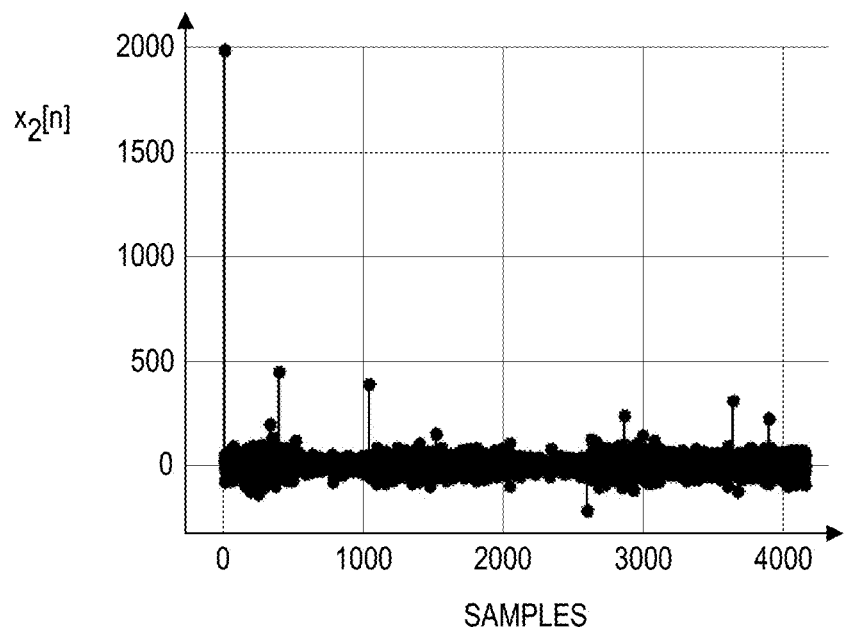
FIGS. 7-10 are graphic diagrams illustrating operation of the decimation filter of FIG. 3 configured according to that described for FIG. 6 receiving as input the PDM bitstream $x_0[n]$ shown in FIG. 6 (based on the AIN_F signal shown in FIG. 5) according to one embodiment.

FIG. 7 is a simplified graphic diagram of $x_2[n]$ versus time at the output of the direct (FWH) transform circuit 304 provided to the comparator 306. The $x_2[n]$ samples include a significant number of smaller samples representing noise at higher frequency.

Figure 8:
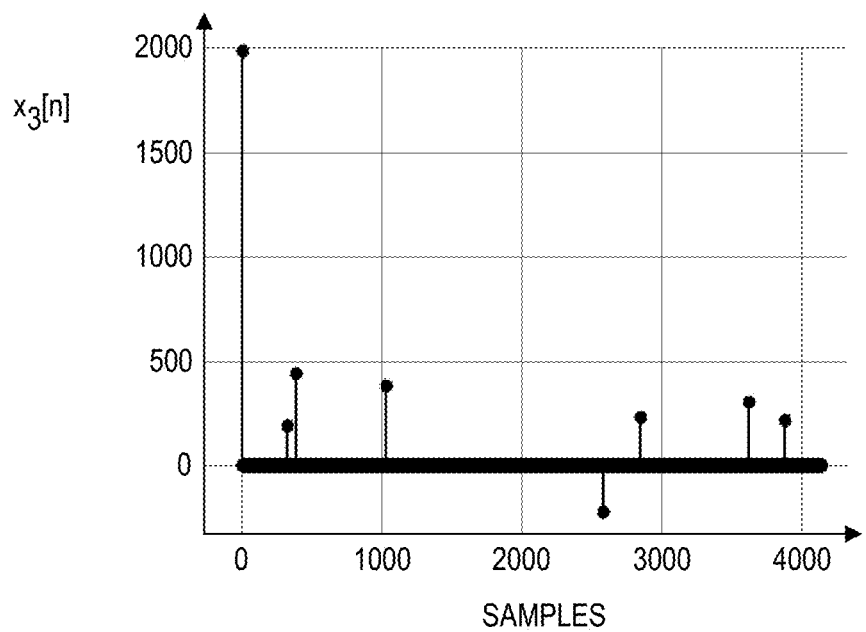

FIG. 8 is a simplified graphic diagram of $x_3[n]$ versus time at the output of the comparator 306, in which the smaller samples having an absolute value less than TH1 have been replaced by zero values. In the illustrated embodiment, the sigma value a is 44.56 and TH1 is 178.26, although these particular values may be different for different embodiments and implementations.

Figure 9:
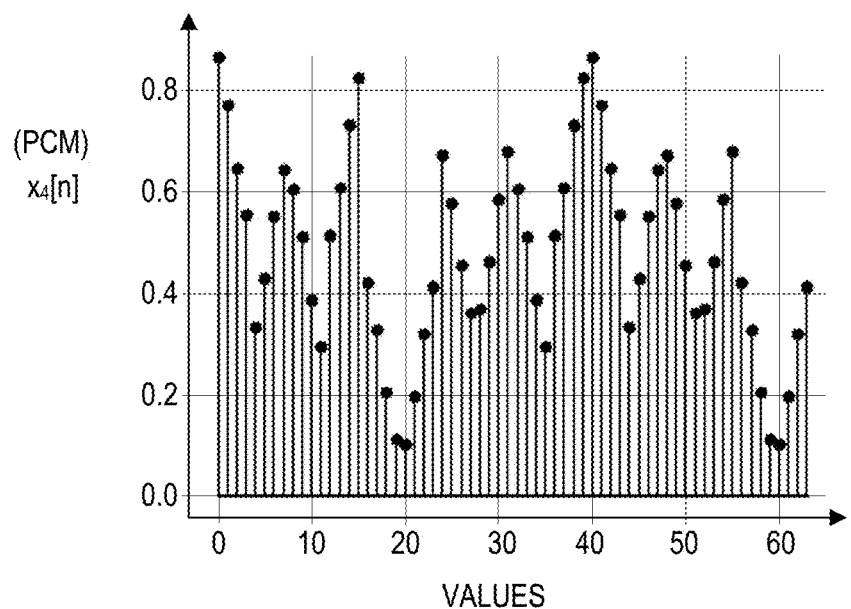

FIG. 9 is a simplified graphic diagram of $x_4[n]$ versus time at the output of the inverse FWH transform circuit 310. The $x_4[n]$ samples illustrate a discrete digital representation of the original analog signal 500.

Figure 10:
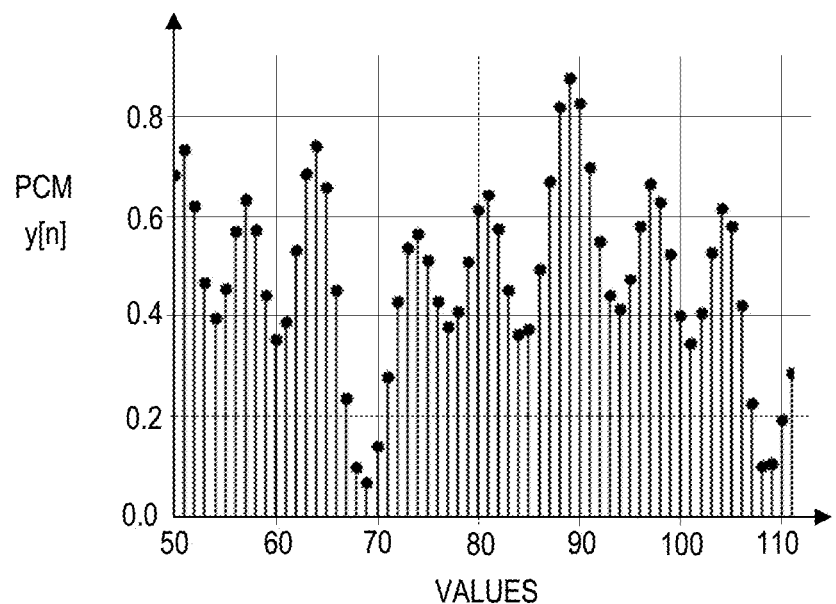

FIG. 10 is a simplified graphic diagram of the PCM data y[n] versus time at the output of the decimator 300 including the additional output filter circuit 312 configured as described for FIG. 6 (fc=6 KHz and R=1).

It is appreciated that the decimation filter 300 performs conversion from a PDM bitstream to PCM data values without a cascaded integrated comb (CIC) filter, a half-band filter, and a finite impulse response (FIR) filter. When $N=2^{14}$ and K=256 (for M=64) the number of additions and subtractions in the direct FWH transform circuit 304 is $N \cdot \log_2(N)$, which is almost 230,000 calculations, and the number of additions and subtractions in the inverse FWH transform circuit 310 is $K \cdot \log_2(K)$, which is only 2,048 calculations. It is noted, however, that the actual number of individual adders/subtractors does not have to equal to the number of add/subtract operations in each implementation. Instead, a significantly smaller number of adders may be used while sequential sums/subtractions are performed. Also, common adder circuitry may be used for the FWH transform circuit 304 and the inverse FWH transform circuit 310. In any given configuration, there is a tradeoff between delay and hardware size depending on the design constraints.

A decimation filter according to one embodiment includes a Hadamard-Walsh transform circuit, a comparator, and an inverse Hadamard-Walsh transform circuit. The Hadamard-Walsh transform circuit includes an input receiving a pulse density modulation bitstream and an output providing a stream of digital samples. The comparator replaces each digital sample that has a magnitude below a predetermined threshold value with a zero value and provides adjusted digital samples. The inverse Hadamard-Walsh transform circuit has an input receiving the adjusted digital samples and has an output providing pulse code modulation data values.

The decimation filter may further include a down-sampler that down samples the adjusted digital samples by before being provided to the inverse Hadamard-Walsh transform circuit. The amount of down-sampling may be determined to translate between a data rate of the pulse density modulation bitstream and a data rate of the pulse code modulation data values. In one embodiment, the Hadamard-Walsh transform circuit processes N bits of the pulse density modulation bitstream and outputs N digital samples at a time, and the inverse Hadamard-Walsh transform circuit processes K=N/M adjusted digital samples and outputs K pulse code modulation data values at a time, in which M is the down-sampling rate The decimation filter may include a calibration circuit that sums a square of each of a set of N of the digital samples from the Hadamard-Walsh transform circuit to determine a sum value, and that divides the sum value by N to determine a sigma value used to determine the predetermined threshold value. The predetermined threshold value may be performed preliminarily in which the predetermined threshold value is stored, or the predetermined threshold value may be updated during run-time.

The decimation filter may include a low pass filter that filters the pulse code modulation data values to provide filtered pulse code modulation data values, and a down-sampler that down samples the filtered pulse code modulation data values to provide output PCM data values.

The Hadamard-Walsh transform circuit may be a direct fast Walsh-Hadamard transform circuit, and the inverse Hadamard-Walsh transform circuit may be an inverse fast Walsh-Hadamard transform circuit. The direct fast Walsh-Hadamard transform circuit performs $N \cdot \log_2(N)$ additions and subtractions to process N bits at a time. When a down-sampler is provided to down sample the adjusted digital samples by M before being provided to the inverse fast Walsh-Hadamard transform circuit, then the inverse fast Walsh-Hadamard transform circuit performs $(N/M) \cdot \log_2(N/M)$ additions and subtractions to process N/M digital samples at a time.

A method of converting a pulse density modulation bitstream to pulse code modulation values according to one embodiment includes transforming N bits of the pulse density modulation bitstream at a time to N digital samples at a time according to a Hadamard-Walsh transform, comparing a magnitude of each of the digital samples with a predetermined threshold, replacing each of the digital samples having a magnitude of less than the predetermined threshold with a zero digital value to provide filtered digital samples, and transforming K of the filtered digital samples at a time to K pulse code modulation values at a time according to an inverse Hadamard-Walsh transform, in which K is less than or equal to N.

The method may include transforming an initial set of N bits of the pulse density modulation bitstream to an initial set of N digital samples, summing a square of each of the initial set of N digital samples to determine a sum value, and dividing the sum value by N to determine a sigma value used to determine the predetermined threshold. The method may include storing the predetermined threshold in a memory for access during the comparing.

The method may include transforming each set of N bits of the pulse density modulation bitstream to a corresponding set of N digital samples, summing a square of each of the corresponding set of N digital samples to determine an updated sum value, and dividing the updated sum value by N to determine an updated sigma value used to update the predetermined threshold.

The method may include low pass filtering the pulse code modulation values to provide filtered pulse code modulation values, and down sampling the filtered pulse code modulation data values to provide output pulse code modulation data values.

The method may include transforming N bits of the pulse density modulation bitstream at a time to N digital samples at a time according to a direct fast Hadamard-Walsh transform, and transforming K of the filtered digital samples at a time to K pulse code modulation values at a time according to a fast inverse Hadamard-Walsh transform. The method may include performing $N \cdot \log_2(N)$ additions and subtractions to process N bits at a time during the direct fast Hadamard-Walsh transform. The method may include down sampling the filtered digital samples by M=N/K, and performing $K \cdot \log_2 K$ additions and subtractions to process K digital samples at a time.

An analog conversion system according to one embodiment includes an input circuit that converts an analog signal to a pulse density modulation bitstream, a Hadamard-Walsh transform circuit having an input receiving the pulse density modulation bitstream and having an output providing a stream of digital samples, a comparator that replaces each of the digital samples having a magnitude below a predetermined threshold value with a zero value and that provides filtered digital samples, a down-sampler that down samples the filtered digital samples to provide down-sampled digital samples, and an inverse Hadamard-Walsh transform circuit having an input receiving the down-sampled digital samples and having an output providing pulse code modulation data values. The input circuit may be a microphone, or a sigma-delta modulator or the like.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims. For example, variations of positive logic or negative logic may be used in various embodiments in which the present invention is not limited to specific logic polarities, device types or voltage levels or the like. The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A decimation filter, comprising:
   a Hadamard-Walsh transform circuit having an input receiving a pulse density modulation bitstream and having an output providing a stream of digital samples;
   a comparator that replaces each of said digital samples having a magnitude below a predetermined threshold value with a zero value and that provides adjusted digital samples; and
   an inverse Hadamard-Walsh transform circuit having an input receiving said adjusted digital samples and having an output providing pulse code modulation data values.

2. The decimation filter of claim 1, further comprising a down-sampler that down samples said adjusted digital samples by M before being provided to said inverse Hadamard-Walsh transform circuit, wherein M is selected to translate between a data rate of said pulse density modulation bitstream and a data rate of said pulse code modulation data values.

3. The decimation filter of claim 2, wherein:
   said Hadamard-Walsh transform circuit processes N bits of said pulse density modulation bitstream and outputs N digital samples at a time; and
   wherein said inverse Hadamard-Walsh transform circuit processes K=N/M adjusted digital samples and outputs K pulse code modulation data values at a time.

4. The decimation filter of claim 1, further comprising a calibration circuit that sums a square of each of a set of N of said digital samples from said Hadamard-Walsh transform circuit to determine a sum value and then divides said sum value by N to determine a sigma value used to determine said predetermined threshold value.

5. The decimation filter of claim 1, further comprising:
   a low pass filter that filters said pulse code modulation data values to provide filtered pulse code modulation data values; and
   a down-sampler that down samples said filtered pulse code modulation data values.

6. The decimation filter of claim 1, wherein:
   said Hadamard-Walsh transform circuit comprises a direct fast Walsh-Hadamard transform circuit; and
   wherein said inverse Hadamard-Walsh transform circuit comprises an inverse fast Walsh-Hadamard transform circuit.

7. The decimation filter of claim 6, wherein said direct fast Walsh-Hadamard transform circuit performs $N \cdot \log_2(N)$ additions and subtractions to process N bits at a time.

8. The decimation filter of claim 7, further comprising:
   a down-sampler that down samples said adjusted digital samples by M before being provided to said inverse fast Walsh-Hadamard transform circuit; and
   wherein said inverse fast Walsh-Hadamard transform circuit performs $(N/M) \cdot \log_2(N/M)$ additions and subtractions to process N/M digital samples at a time.

9. A method of converting a pulse density modulation bitstream to pulse code modulation values, comprising:
   transforming N bits of the pulse density modulation bitstream at a time to N digital samples at a time according to a Hadamard-Walsh transform;
   comparing a magnitude of each of the digital samples with a predetermined threshold;
   replacing each of the digital samples having a magnitude of less than the predetermined threshold with a zero digital value to provide filtered digital samples; and
   transforming K of the filtered digital samples at a time to K pulse code modulation values at a time according to an inverse Hadamard-Walsh transform, wherein K is less than or equal to N.

10. The method of claim 9, further comprising down sampling the filtered digital samples by M before being transformed according to the inverse Hadamard-Walsh transform, wherein K=N/M and wherein M is selected to translate between a data rate of the pulse density modulation bitstream and a data rate of the pulse code modulation data values.

11. The method of claim 9, prior to said transforming N bits of the pulse density modulation bitstream at a time, further comprising:
   transforming an initial set of N bits of the pulse density modulation bitstream to an initial set of N digital samples;
   summing a square of each of the initial set of N digital samples to determine a sum value; and
   dividing the sum value by N to determine a sigma value used to determine the predetermined threshold.

12. The method of claim 11, further comprising storing the predetermined threshold in a memory for access during said comparing.

13. The method of claim 9, further comprising:
   transforming each set of N bits of the pulse density modulation bitstream to a corresponding set of N digital samples;
   summing a square of each of the corresponding set of N digital samples to determine an updated sum value; and
   dividing the updated sum value by N to determine an updated sigma value used to update the predetermined threshold.

14. The method of claim 9, further comprising:
   low pass filtering the pulse code modulation values to provide filtered pulse code modulation values; and
   down sampling the filtered pulse code modulation data values to provide output pulse code modulation data values.

15. The method of claim 9, wherein:
   said transforming N bits of the pulse density modulation bitstream at a time to N digital samples comprises transforming N bits of the pulse density modulation bitstream at a time to N digital samples at a time according to a direct fast Hadamard-Walsh transform; and
   wherein said transforming K of the filtered digital samples at a time to K pulse code modulation values comprises transforming K of the filtered digital samples at a time to K pulse code modulation values at a time according to a fast inverse Hadamard-Walsh transform.

16. The method of claim 15, wherein said transforming N bits of the pulse density modulation bitstream at a time to N digital samples at a time according to a direct fast Hadamard-Walsh transform comprises performing $N \cdot \log_2(N)$ additions and subtractions to process N bits at a time.

17. The method of claim 16, further comprising:
   down sampling the filtered digital samples by M; and
   wherein said transforming K of the filtered digital samples at a time to K pulse code modulation values at a time according to a fast inverse Hadamard-Walsh transform comprises performing $K \cdot \log_2 K$ additions and subtractions to process K digital samples at a time.

18. An analog conversion system, comprising:
   an input circuit that converts an analog signal to a pulse density modulation bitstream;
   a Hadamard-Walsh transform circuit having an input receiving said pulse density modulation bitstream and having an output providing a stream of digital samples;
   a comparator that replaces each of said digital samples having a magnitude below a predetermined threshold value with a zero value and that provides filtered digital samples;
   a down-sampler that down samples said filtered digital samples to provide down-sampled digital samples; and
   an inverse Hadamard-Walsh transform circuit having an input receiving said down-sampled digital samples and having an output providing pulse code modulation data values.

19. The analog conversion system of claim 18, wherein said input circuit comprises a microphone.

20. The analog conversion system of claim 18, wherein said input circuit comprises a sigma-delta modulator.

\* \* \* \* \*